(12) United States Patent
Hartenstein

(10) Patent No.: US 11,072,276 B2
(45) Date of Patent: Jul. 27, 2021

(54) LIGHTING APPARATUS FOR A VEHICLE, METHOD OF INSTALLING A LIGHTING APPARATUS ONTO A VEHICLE, AND LIGHTING APPARATUS KIT FOR A VEHICLE

(71) Applicant: Justin Hartenstein, Metairie, LA (US)

(72) Inventor: Justin Hartenstein, Metairie, LA (US)

(73) Assignee: AAC Enterprises LLC, Metairie, LA (US)

( * ) Notice: Subject to any disclaimer, the term of this patent is extended or adjusted under 35 U.S.C. 154(b) by 102 days.

(21) Appl. No.: 16/778,331

(22) Filed: Jan. 31, 2020

(65) Prior Publication Data
US 2020/0262337 A1  Aug. 20, 2020

Related U.S. Application Data

(60) Provisional application No. 62/807,058, filed on Feb. 18, 2019.

(51) Int. Cl.
| | |
|---|---|
| *B60Q 1/26* | (2006.01) |
| *H05K 1/02* | (2006.01) |
| *F21Y 115/10* | (2016.01) |
| *F21S 4/20* | (2016.01) |

(52) U.S. Cl.
CPC .......... *B60Q 1/2696* (2013.01); *H05K 1/024* (2013.01); *H05K 1/0231* (2013.01); *F21S 4/20* (2016.01); *F21Y 2115/10* (2016.08)

(58) Field of Classification Search
CPC .............. B60Q 2900/10; B60Q 1/0052; B60Q 1/2696; F21S 41/50; F21S 41/55
See application file for complete search history.

(56) References Cited

U.S. PATENT DOCUMENTS

| | | | |
|---|---|---|---|
| 8,305,225 B2 | 11/2012 | Hefright et al. | |
| 2006/0256567 A1* | 11/2006 | Chen | B60Q 1/0052 362/382 |
| 2009/0175047 A1* | 7/2009 | Tsai | B60Q 1/0041 362/487 |
| 2010/0177528 A1* | 7/2010 | Law | B60Q 1/0041 362/541 |
| 2017/0108191 A1* | 4/2017 | Nishihata | F21S 41/39 |
| 2017/0253176 A1* | 9/2017 | Westerman | B60Q 1/0088 |
| 2017/0341563 A1* | 11/2017 | Kossoff | F21S 45/47 |
| 2018/0094789 A1* | 4/2018 | Hontz | B60Q 1/0052 |
| 2018/0245754 A1* | 8/2018 | Gensler | F21V 3/10 |
| 2019/0070998 A1* | 3/2019 | Spencer | B60Q 1/2615 |

* cited by examiner

*Primary Examiner* — Andrew J Coughlin
(74) *Attorney, Agent, or Firm* — Edwin A. Sisson, Attorney at Law, LLC; Jeffrey J. Banyas

(57) ABSTRACT

It is described herein a lighting apparatus for a vehicle. The lighting apparatus may comprise a lighting trim ring and a lighting element attached to an outer surface of the lighting trim ring. Also described herein is a lighting apparatus kit for a vehicle which may comprise the lighting trim ring and the lighting element. Also described herein is a method of installing a lighting apparatus onto a vehicle over an existing automotive lighting fixture such as a head light, tail light, fog light, or marker light.

18 Claims, 5 Drawing Sheets

LIGHTING APPARATUS FOR A VEHICLE, METHOD OF INSTALLING A LIGHTING APPARATUS ONTO A VEHICLE, AND LIGHTING APPARATUS KIT FOR A VEHICLE

CROSS REFERENCES AND PRIORITIES

This application claims priority from U.S. Provisional Application No. 62/807,058 filed on 18 Feb. 2019, the teachings of which are incorporated by reference herein in their entirety.

BACKGROUND

Vehicles such as cars, trucks, sport utility vehicles, and the like are typically manufactured with a variety of lighting elements including headlights, turn signal lights, tail lights, and marker lights. The normal lighting element comes as a pre-built assembly or fixture that contains one or more bulbs and at least one reflector housed within a frame behind an automotive lamp lens.

In recent years, efforts have been made to customize the aesthetics and performance of automotive lighting systems. Advancements in light emitting diode ("LED") technologies have allowed for the development of customized lighting solutions which can be used throughout a vehicle's exterior or interior.

One such solution is described in U.S. Pat. No. 8,305,225 (the "225 patent"), which describes, "[a] lamp assembly to be incorporated into or positioned on a truck's existing support structure." The lamp assembly described in the '225 patent includes "a heat sink, an electrically insulating dielectric coating disposed on said heat sink, a plurality of circuit traces disposed on said dielectric coating, a plurality of light emitting diodes spaced apart and electrically connected to one another by said plurality of circuit traces . . . and a cover disposed substantially over and protecting said heat sink, said dielectric coating, said plurality of circuit traces, and said plurality of light emitting diodes."

Customization of automotive lighting solutions presents many problems. For instance, installation of custom automotive lighting solutions often requires a complex and time consuming process of removing the existing automotive lighting fixture from the vehicle, un-sealing or opening the fixture, attaching a custom lighting element within the fixture, re-sealing the fixture, attaching the electrical connections for the custom lighting solution to the vehicle's power supply, and re-installing the fixture to the vehicle.

Another problem arises when one wishes to add custom lighting solutions in the same general area as existing, factory-installed lighting elements. As space within the lighting fixture is limited, it is often difficult or impossible to install a custom lighting element without blocking or interfering with the light output of the original, factory-installed lighting elements.

Yet another problem rests in protecting the custom lighting element from the damaging effects of precipitation (rain, snow, etc.) and/or road debris. If all of the electronic components of a custom lighting solution are not properly sealed, they may become exposed to precipitation during ordinary use, which can cause corrosion or dangerous short circuiting. Additionally, all lighting elements must be capable of reasonably withstanding impacts from road debris such as rocks, salt, sand, gravel, trash and the like without breaking the lighting element.

The need exists, therefore, for an improved lighting apparatus for a vehicle which is easy to install, minimizes or eliminates blockages to original, factory-installed lighting elements, and offers adequate protection against precipitation and road debris.

SUMMARY

A lighting apparatus for a vehicle is disclosed. The lighting apparatus comprises a lighting trim ring and a lighting element. The lighting element may comprise a printed circuit board, a plurality of light emitting diodes each mounted on the printed circuit board, and an electrical communication connection connected to the printed circuit board. The printed circuit board and the plurality of light emitting diodes may be sealed in a polymer material. The lighting element may be attached to a lighting trim ring outer surface of the lighting trim ring.

In some embodiments, the lighting trim ring may comprise at least one automotive lamp opening. The lighting trim ring outer surface may then define at least a portion of a perimeter of the automotive lamp opening. The lighting trim ring may be further adapted to fit partially or fully over an automotive lighting fixture.

In some embodiments, the plurality of light emitting diodes may comprise at least one LED selected from the group consisting of a white LED, a color changing LED, a red LED, a green LED, a blue LED, an orange LED, a yellow LED, a purple LED, and an amber LED.

The polymer material may be selected from the group consisting of epoxies, silicones, thermosets, and thermoplastics. In some embodiments, the polymer material comprises a non-conductive resin. The non-conductive resin may be a di-electric resin.

In some embodiments, the polymer material may contain one or more features selected from the group consisting of coloring, opaque materials, texturing, or diffusing materials.

In some embodiments, the polymer material may be contained within a shell. The shell may be made of a rigid material selected from the group consisting of polyesters, polyamides, polyurethanes, and glass. In some embodiments, the shell may contain one or more features selected from the group consisting of coloring, opaque materials, texturing, or diffusing materials.

The lighting element may be attached to the lighting trim ring outer surface by an attachment mechanism. The attachment mechanism may be selected from the group consisting of an adhesive, a tape, one or more clips, one or more screws, and combinations thereof.

A lighting apparatus kit for a vehicle is also disclosed. The lighting apparatus kit may comprise a lighting trim ring and a lighting element. The lighting element may comprise a printed circuit board, a plurality of light emitting diodes, an electrical communication connection, and an adhesive. The printed circuit board will have a first face and a second face. The plurality of light emitting diodes may be mounted on the first face. The plurality of light emitting diodes and the printed circuit board may be sealed in a polymer material. The electric communication connection may be connected to the printed circuit board. The adhesive may be attached to a bottom face of the plastic material corresponding to the second face of the printed circuit board.

The lighting trim ring of the lighting apparatus kit may comprise at least one automotive lamp opening. A lighting trim ring outer surface may define at least a portion of a perimeter of the automotive lamp opening. The lighting trim ring may be adapted to fit partially or fully over an automotive lighting fixture.

In some embodiments, the plurality of light emitting diodes of the lighting element of the lighting apparatus kit may comprise at least one LED selected from the group consisting of a white LED, a color changing LED, a red LED, a green LED, a blue LED, an orange LED, a yellow LED, a purple LED, and an amber LED.

The polymer material of the lighting apparatus kit may be selected from the group consisting of epoxies, silicones, thermosets, and thermoplastics. In some embodiments, the polymer material may comprise a non-conductive resin. The non-conductive resin may be a di-electric resin.

In some embodiments, the polymer material of the lighting apparatus kit may contain one or more features selected from the group consisting of coloring, opaque materials, texturing, or diffusing materials.

In some embodiments, the polymer material of the lighting apparatus kit may be contained within a shell. The shell may be made of a rigid material selected from the group consisting of polyesters, polyamides, polyurethanes, and glass. In some embodiments the shell may contain one or more features selected from the group consisting of coloring, opaque materials, texturing, or diffusing materials.

A method of installing a lighting apparatus onto a vehicle is also disclosed. The lighting apparatus may comprise a lighting trim ring, a lighting element, and an adhesive. The lighting element may comprise a plurality of light emitting diodes mounted on a printed circuit board and sealed in a polymer material. The lighting apparatus may also comprise an electric communication connection connected to the printed circuit board. The adhesive may be attached to a bottom face of the polymer material. The adhesive may also comprise a removable backing member.

The method of installing a lighting apparatus onto a vehicle may first comprise the step of removing the removable backing member. The method may then comprise adhering the lighting element to a protrusion of a lighting trim ring outer surface. Next, the method may comprise connecting the electric communication connection to a power source located within the vehicle. Finally, the method may comprise attaching the lighting trim ring to an automotive lighting fixture.

DETAILED DESCRIPTION

Disclosed herein is a lighting apparatus for a vehicle, a lighting apparatus kit for a vehicle, and a method of installing a lighting apparatus onto a vehicle. The lighting apparatus, lighting apparatus kit, and method of installing a lighting apparatus are described below with reference to the Figures. As described herein and in the claims, the following numbers refer to the following structures as noted in the Figures.

10 refers to a lighting apparatus.
100 refers to a lighting trim ring.
110 refers to a lighting trim ring outer surface.
120 refers to a lighting trim ring inner surface.
130 refers to an automotive lamp opening.
140 refers to a protrusion.
200 refers to a lighting element.
210 refers to a printed circuit board.
212 refers to a first face (of the printed circuit board).
214 refers to a second face (of the printed circuit board).
220 refers to a light emitting diode.
230 refers to an electrical communication connection.
232 refers to a wire.
242 refers to an adhesive.
244 refers to a removable backing member.
300 refers to a plastic material.
310 refers to a bottom face (of the plastic material).
400 refers to an automotive lamp lens.
410 refers to an existing automotive lighting fixture.

Figure 1:
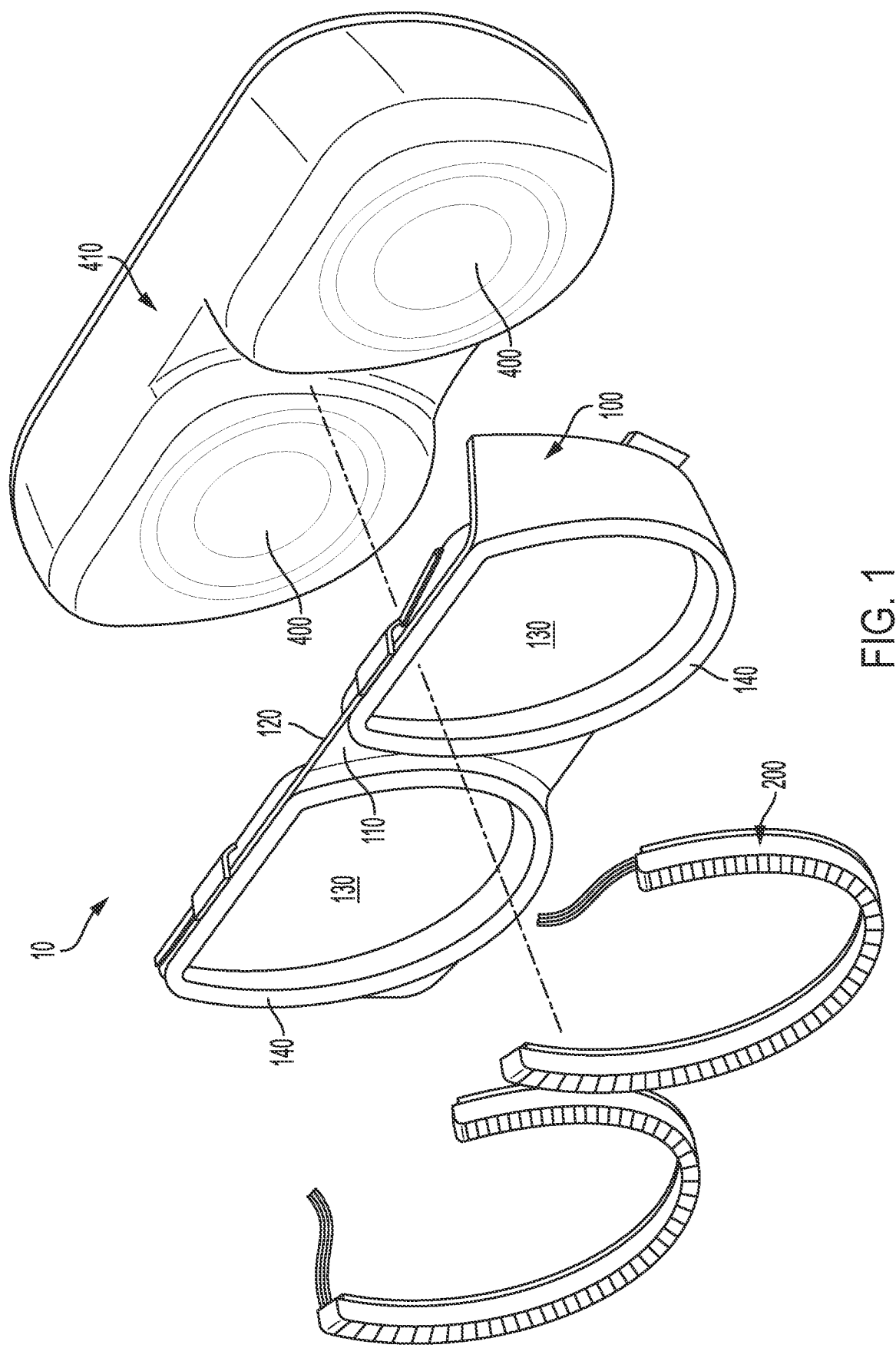
FIG. 1 is an exploded perspective view of a lighting apparatus for a vehicle.

FIG. 1 depicts an exploded perspective view of one embodiment of a lighting apparatus (10) for a vehicle. As shown in FIG. 1, the lighting apparatus may comprise a lighting trim ring (100) and a lighting element (200).

The lighting trim ring (100) may be designed to fit partially or fully around an existing automotive lighting fixture (410) such as a headlight fixture, a tail light fixture, a fog light fixture, or a marker light fixture. The existing automotive lighting fixture may be factory installed on the vehicle, or may be an aftermarket repair or modification fixture. In some embodiments, once installed the lighting trim ring will cover a portion of an automotive lamp lens (400) of the existing automotive lighting fixture. Preferably, the portion of the automotive lamp lens covered by the lighting trim ring does not correspond to the location of the light output from the existing automotive lighting fixture. However, in some embodiments the lighting trim ring may block a minimal portion of the light output from the existing automotive lighting fixture defined as less than 20% of the light output with less than 15% of the light output being more preferred, less than 10% of the light output being even more preferred, less than 5% of the light output being still more preferred, and 0% of the light output being most preferred.

Measuring the light output may be conducted according to any number of known techniques. One preferred technique involves placing a digital light meter (which measures light output in lux—a measure of how much luminous flux (or lumens) is spread out over a given area) at a defined distance from the automotive lighting fixture. This defined distance is typically in the range of between 5 feet and 40 feet with 25 feet being most preferred. Preferably, the digital light meter is placed at an elevation which is identical to or substantially identical to the elevation of the light source of the automotive lighting fixture. It is also preferred that the measurement be taken in a darkened room which is devoid of secondary light sources that may interfere with the measurement. The light output may be measured with and without the lighting trim ring to determine how much, if any, of the light output is blocked by the lighting trim ring. For example, when an automotive lighting fixture generates 360 lux at 25 feet without a lighting trim ring installed, and 340 lux at 25 feet with a lighting trim ring installed, the lighting trim ring has blocked 5.56% of the light output ((340−360)/360×100=−5.56).

The lighting trim ring will have a lighting trim ring outer surface (110) and a lighting trim ring inner surface (120) opposite the lighting trim ring outer surface. When installed on a vehicle, the lighting trim ring outer surface will face away from the vehicle, while the lighting trim ring inner surface will face towards the vehicle.

FIG. 1 also shows the lighting trim ring (100) which may comprise at least one automotive lamp opening (130). When present, the automotive lamp opening will pass from the lighting trim ring outer surface (110) through the lighting trim ring inner surface (120). One will recognize that, as the automotive lamp opening passes from the lighting trim ring outer surface through the lighting trim ring inner surface, the lighting trim ring outer surface defines at least a portion of the perimeter of the automotive lamp opening.

When present and installed on a vehicle, the at least one automotive lamp opening (130) is preferably located proximate to the position of a corresponding light source from the existing automotive lighting fixture to allow light from the light source to pass through the lighting trim ring. For example, when the existing automotive lighting fixture is a headlight fixture comprising a headlight light source, the automotive lamp opening may be located proximate to the position of the headlight light source to allow light from the headlight light source to pass through the lighting trim ring when the lighting trim ring is installed on a vehicle.

Similarly, the size and shape of the automotive lamp opening (130) may correspond to the size and shape of the corresponding light source from the existing automotive lighting fixture. Preferably, the inner dimensions of the automotive lamp opening will be larger than the outer dimension of the light source of the existing automotive lighting fixture. For example, when the existing automotive lighting fixture is a headlight fixture comprising a headlight light source comprising a plurality of light emitting diodes (LEDs) arranged in a circular pattern having an outside diameter of six (6) inches, the corresponding automotive lamp opening will preferably have a circular shape having an inside diameter of at least six (6) inches with slightly greater than six (6) inches being preferred. In this context, "slightly greater" may be defined as in a range selected from the group consisting of between 0.01% and 5.0% greater than, between 0.01% and 2.5% greater than, between 0.01% and 1.0% greater than, between 0.1% and 5.0% greater than, between 0.1% and 2.5% greater than, between 0.1% and 1.0% greater than, between 0.5% and 5.0% greater than, between 0.5% and 2.5% greater than, and between 0.5% and 1.0% greater than.

In some embodiments, there may be multiple automotive lamp openings. In practice, the number and location of automotive lamp openings may depend upon the number and location of light source(s) of the existing automotive lighting fixture. For example, when the existing automotive lighting fixture is a taillight fixture comprising a tail light and a brake light, there may be two automotive lamp openings in the lighting trim ring (100), a first automotive lamp opening corresponding to the location of the tail light, and a second automotive lamp opening corresponding to the location of the brake light.

In some embodiments, one or more of the automotive lamp openings may include a protrusion (140). In some embodiments, when present, the protrusion may extend from the lighting trim ring outer surface (110) in which case the protrusion is considered to be a part of the lighting trim ring outer surface. In other embodiments, when present, the protrusion may extend from the lighting trim ring inner surface (120) in which case the protrusion is considered to be a part of the lighting trim ring inner surface. In still other embodiments, the protrusion may extend in one direction from the lighting trim ring outer surface and in the opposite direction from the lighting trim ring inner surface; in which case the protrusion may be thought of as two separate protrusions, one of which is a part of the lighting trim ring outer surface while the other is a part of the lighting trim ring inner surface.

Figure 5:
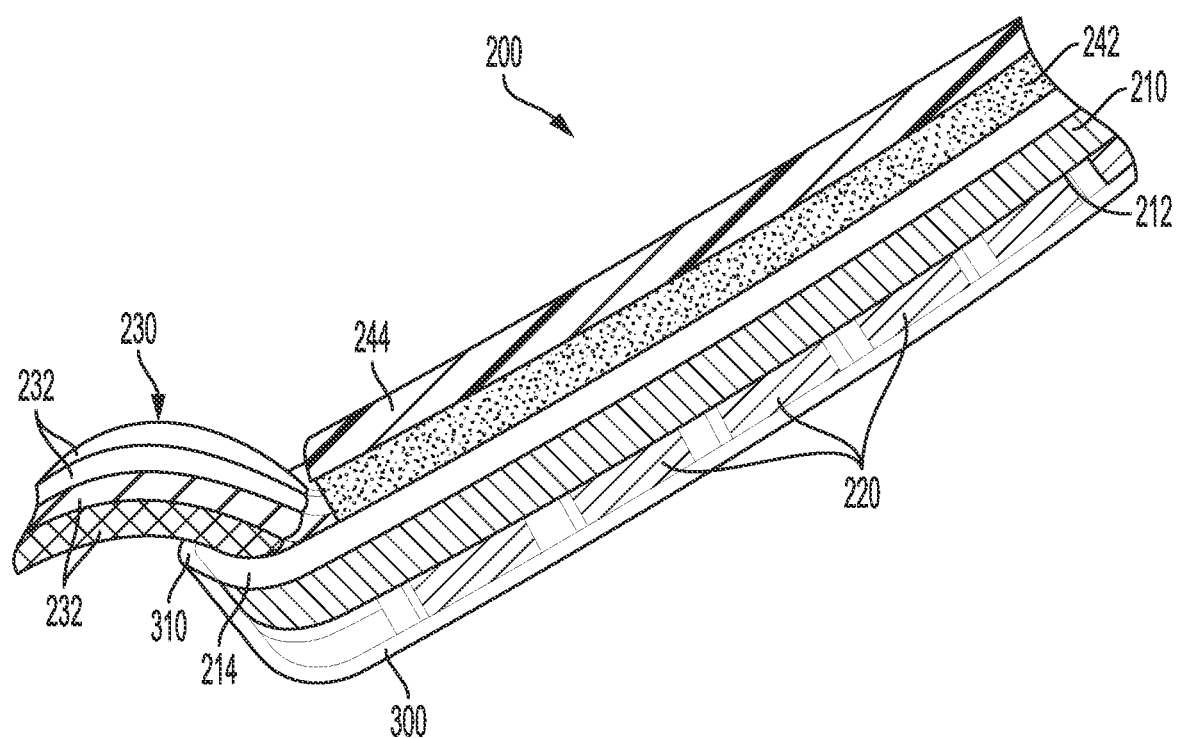
FIG. 5 is a cross section side view of a lighting element.

FIG. 1 also shows the lighting element (200), the details of which are shown in FIG. 5. As shown in FIG. 5, the lighting element may comprise a printed circuit board (210). The printed circuit board may have a first face (212) and a second face (214) opposite the first face. When installed on a vehicle, the first face will face away from the vehicle, while the second face will face towards the vehicle.

While the Figures show the lighting element and its various components (including the printed circuit board (210) and the polymer material (300)) in a semi-circle shape, in practice the lighting element may come in many different sizes and shapes. The size and shape of the lighting element may depend upon a number of factors, most notably, the size and shape of the automotive lamp opening to which the lighting element is intended to be mounted. Some common shapes include a circle, an oval, a semi-circle, a square (with rounded or sharp corners), a rectangle (with rounded or sharp corners), a "C" shape, and a "U" shape.

As shown in FIG. 5, there will be a plurality of light emitting diodes (220)—also known as LEDs—mounted on the first face (212) of the printed circuit board. A light emitting diode is a semiconductor light source which emits light when current flows through it.

Light emitting diodes come in a number of configurations. One common configuration of light emitting diode is a surface-mounted device (SMD). An SMD light emitting diode is mounted or placed directly onto the surface of a printed circuit board and is connected to the printed circuit board by an alloy wire. Another configuration is through-hole technology in which a lead on the light emitting diode is inserted into a hole drilled into a printed circuit board and soldered to pads on the opposite side. Another configuration is chip on board (COB) LEDs in which a bare chip is mounted directly onto the printed circuit board. Another configuration is chip scale package (CSP) LEDs in which the light emitting diode is mounted on an interposer or etched or printed directly onto a silicon wafer. The specific configuration of light emitting diode is not considered important to the invention, and can be selected from the group consisting of a surface-mounted device, a through-hole device, a light emitting plasma LED, and combinations thereof. Preferably, each light emitting diode in the same lighting element will be of the same configuration, although embodiments may exist which combine different light emitting diode configurations within the same lighting element.

Light emitting diodes come in a variety of colors. Two common colors for automotive applications are white light emitting diodes, and color changing light emitting diodes. Accordingly, in some embodiments, the plurality of light emitting diodes may comprise at least one white light emitting diode. In other embodiments, each light emitting diode of the plurality of light emitting diodes may be a white light emitting diode. In still other embodiments, the plurality of light emitting diodes may comprise at least one color changing light emitting diode. In yet other embodiments, each light emitting diode of the plurality of light emitting diodes may be a color changing light emitting diode. Other common colors for the light emitting diodes include red, green, blue, orange, yellow, purple, amber, and combinations thereof.

As also shown in FIG. 5, there may also be an electrical communication connection (230) electrically connected to the printed circuit board. The electrical communication connection may comprise a plurality of wires (232) electrically connected at a first end to the printed circuit board and at a second end to a connector (234). The type and configuration of connector will depend upon a number of different variables including, but not limited to, the make and model of the vehicle, and the intended effect (headlight, tail light, turn signal, daytime running light, etc.) of the lighting element. The electrical connector may then be electrically connected to a power source located within the vehicle which allows the lighting element to be turned on or off (such as when the lighting element is to be used as a headlight, tail light, marker light, or daytime running light) or to perform a function to notify an observer of the vehicle of certain information (such as when the lighting element is to be used as a turn signal light, an emergency strobe light, a brake light, or a reverse light).

FIG. 5 also shows the printed circuit board (210) and the plurality of light emitting diodes (220) encapsulated in a polymer material (300). Examples of such polymer materials include epoxies, silicones, thermosets, and thermoplastics. The epoxies may be selected from two-part epoxies and one-part epoxies, and may be either heat curable or UV curable. Preferably, the polymer material comprises a non-conductive resin. A preferred non-conductive resin is a dielectric resin. One example of a dielectric resin is EPO-TEK® 301-1 available from Epoxy Technology, Inc. of Billerica, Mass., U.S.A. In some applications, the encapsulation of the light emitting diodes in a polymer material may be referred to as conformal coating in which a thin layer of the polymer material conforms to the contours of the printed circuit board and/or light emitting diodes to provide protection from the damaging effects of corrosion, precipitation, road debris, and other contaminants.

In order to protect against the damaging effects of road debris, the plastic material should be impact resistant. The plastic material is preferably transparent. As used herein, "transparent" may be defined as a material having a total transmittance (incident light-transmitted light) of at least 90.0% with at least 95.0% being preferred, at least 97.5% being more preferred, at least 99.0% being still more preferred, and 100% being most preferred. However, the plastic material may also include features such as coloring, opaque materials, texturing, or diffusing materials. In some embodiments, the plastic material may also contain a UV blocker.

The printed circuit board (210) and the plurality of light emitting diodes (220) may be sealed in the polymer material using any number of different manufacturing techniques. Examples of such manufacturing techniques include injection molding, compression molding, and transfer molding.

The preferred manufacturing technique is injection molding. In the injection molding process, uncured molten resin is injected into a mold which contains the various components of the lighting element (200). In the injection molding process, the printed circuit board (210) having the plurality of light emitting diodes (220) and a portion of the electrical communication connection (230) which is electrically connected to the printed circuit board are placed into the mold cavity. It will be recognized that, in order to allow the electrical communication connection to connect to a power source located within the vehicle, a portion of the wires (232) extending to the connector (234) should be placed outside of the mold cavity. The resin is first fed into a heated barrel where it is mixed and then injected into the mold cavity around the printed circuit board, the light emitting diodes, and the portion of the electrical communication connection. The resin is then cooled to allow the resin to cure and solidify prior to removal from the mold. One type of injection molding is polycast molding available from Poly-Cast, Inc. of Tigard, Oreg., U.S.A.

In some embodiments, the polymer material may be contained within a shell. The shell may provide further protection from the damaging effects of road debris. The shell is preferably made of a rigid material. Such materials may include polyesters, polyamides, polyurethanes, and glass. The shell may be formed by an number of manufacturing techniques, the most common of which is blow molding. The shell may be transparent, or may include features such as coloring, opaque materials, texturing, and diffusing materials. The shell may or may not include a UV blocker. As used herein, "transparent" may be defined as a material having a total transmittance (incident light–transmitted light) of at least 90.0% with at least 95.0% being preferred, at least 97.5% being more preferred, at least 99.0% being still more preferred, and 100% being most preferred.

As shown in FIG. 5, the lighting element (200) may also comprise an adhesive (242) for attaching the lighting element to the lighting trim ring (100). Examples of such adhesives include double-sided foamed tape. A preferred adhesive is a VHB tape available from 3M Company of Maplewood, Minn. The adhesive may comprise a removable backing member (244) which can be peeled off prior to attaching the lighting element to the lighting trim ring by way of the adhesive.

Figure 2:
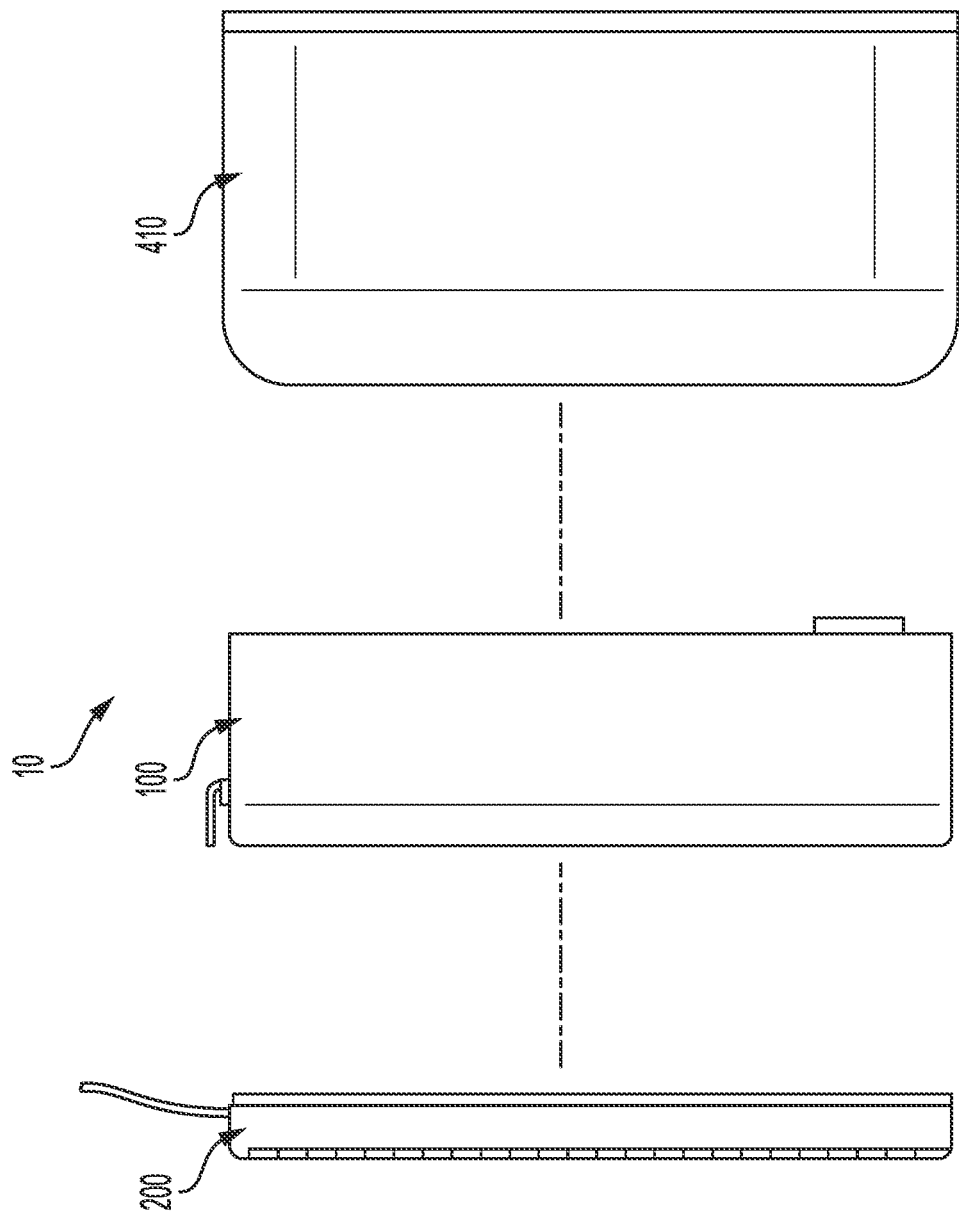
FIG. 2 is an exploded side view of a lighting apparatus for a vehicle.

FIG. 2 depicts an exploded side view of one embodiment of a lighting apparatus (10) for a vehicle. FIG. 2 shows both the lighting trim ring (100) and the lighting element (200). FIG. 2 also shows the existing automotive lighting fixture (410).

Figure 3:
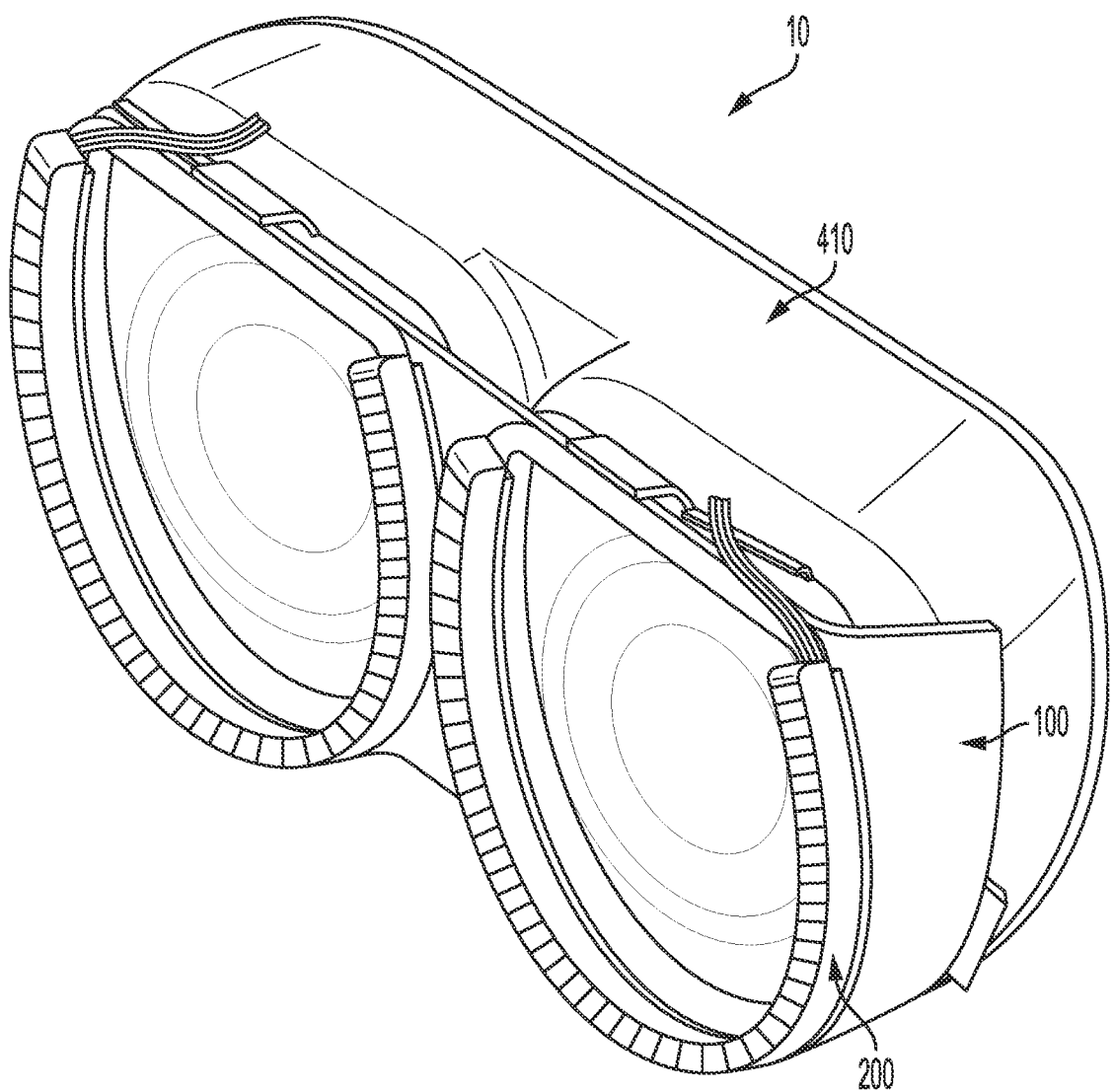
FIG. 3 is an assembled perspective view of a lighting apparatus for a vehicle.

FIG. 3 depicts an assembled perspective view of the embodiment of a lighting apparatus (10) for a vehicle of FIG. 1. As shown in FIG. 3, the lighting apparatus is assembled by attaching the lighting trim ring (100) to the surface of the vehicle. Preferably, the surface will be the existing automotive lighting fixture (410) such as a headlight fixture, a tail light fixture, a fog light fixture, or a marker light fixture.

Attaching the lighting trim ring (100) to the surface of the vehicle may include the use of any number of fasteners. Such fasteners may include one or more screws, one or more nuts and bolts, one or more rivets, one or more clips, one or more clamps, and combinations thereof. In some embodiments, attaching the lighting trim ring to the surface of the vehicle may be assisted by an adhesive layer between at least a portion of the lighting trim ring inner surface (120) and the surface of the vehicle. In some embodiments, attaching the lighting trim ring to the surface of the vehicle may be accomplished entirely by use of an adhesive layer between at least a portion of the lighting trim ring inner surface and the surface of the vehicle.

Assembling the lighting apparatus may also include attaching the lighting element (200) to the lighting trim ring outer surface (110). Preferably, the lighting element will be attached to the portion of the lighting trim ring outer surface which defines at least a portion of the perimeter of the automotive lamp opening. In some embodiments, the lighting trim ring outer surface to which the lighting element will be attached may include—in whole or in part—the protrusion (140).

Attaching the lighting element (200) to the lighting trim ring outer surface (110) may include the use of any number of attachment mechanisms. The attachment mechanism may be selected from the group consisting of an adhesive, a tape, one or more clips, one or more screws, and combinations thereof. A preferred attachment mechanism is VHB tape available from 3M Company of Maplewood, Minn.

Figure 4:
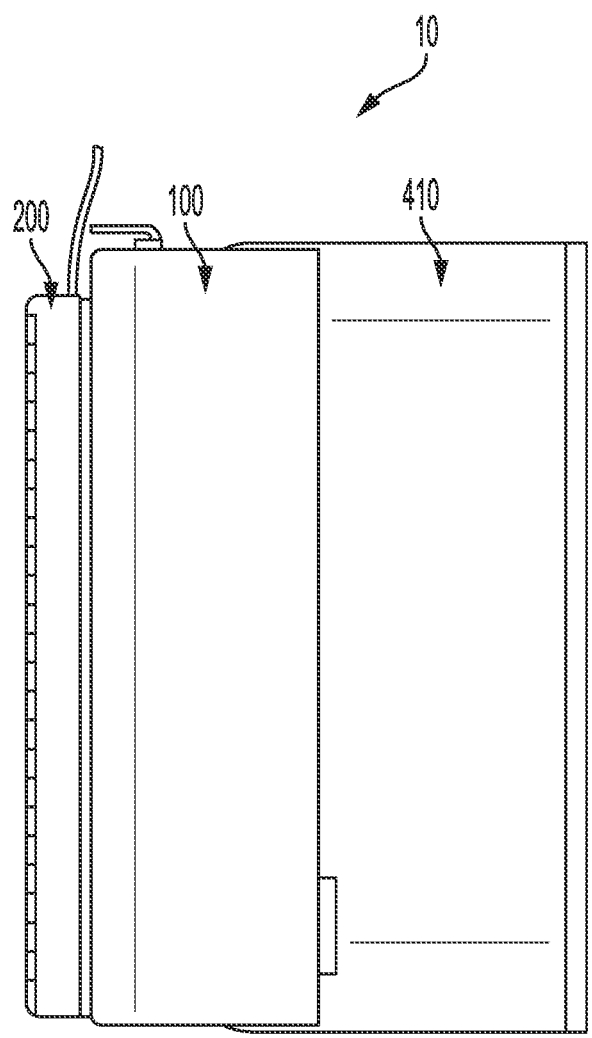
FIG. 4 is an assembled side view of a lighting apparatus for a vehicle.

FIG. 4 depicts an assembled side view of the embodiment of a lighting apparatus (10) for a vehicle of FIG. 2. FIG. 4 shows the lighting trim ring (100) installed on the existing automotive lighting fixture (410) with the lighting element (200) attached to the lighting trim ring.

The various components may also be in the form of a lighting apparatus kit for a vehicle. The lighting apparatus kit may include both a lighting trim ring (100), and a lighting element (200). In some embodiments, the lighting apparatus kit may also include an automotive lighting fixture (410), however, an automotive lighting fixture is not considered to be a required element of the lighting apparatus kit. The lighting apparatus kit may be designed for installation on an existing automotive lighting fixture, in which case the lighting apparatus kit would not include an automotive lighting fixture.

The lighting element (200) included in the lighting apparatus kit may be of the type described herein. Specifically, the lighting element may comprise a printed circuit board (210). The printed circuit board may have a first face (212) and a second face (214) opposite the first face. The lighting element may also have a plurality of light emitting diodes (220) also known as LEDs. Each light emitting diode of the plurality of light emitting diodes may be mounted on the first face of the printed circuit board.

The printed circuit board (210) and the plurality of light emitting diodes (220) of the lighting element (200) in the lighting apparatus kit may be sealed in a polymer material (300). The plastic material will have a bottom face (310) which corresponds to the second face of the printed circuit board opposite the first face of the printed circuit board to which each light emitting diode of the plurality of light emitting diodes is mounted.

The lighting element (200) of the lighting apparatus kit may also include an electric communication connection (230). The electric communication connection will be electrically connected to one face of the printed circuit board. Preferably, at least a portion of the electric communication connection will extend outside of the plastic material.

The lighting trim ring (100) of the lighting apparatus kit may comprise at least one automotive lamp opening (130) as described herein. The lighting trim ring may also comprise a lighting trim ring outer surface (110) which defines at least a portion of the perimeter of an automotive lamp opening. Preferably, the lighting trim ring is adapted to fit over an automotive lamp lens (400) of an automotive lighting fixture.

The light emitting diodes (220) of the lighting element (200) of the lighting apparatus kit may be any type of light emitting diode, including those disclosed herein and those yet to be invented. In some embodiments, the plurality of light emitting diodes comprises at least one white LED. In other embodiments, the plurality of light emitting diodes comprises at least one color changing LED.

The polymer material (300) of the lighting element (200) of the lighting apparatus kit may be a dielectric resin of the type disclosed herein. In order to protect against the damaging effects of road debris, the plastic material should be rigid. Preferably, the plastic material is transparent. As used herein, "transparent" may be defined as a material having a total transmittance (incident light–transmitted light) of at least 90.0% with at least 95.0% being preferred, at least 97.5% being more preferred, at least 99.0% being still more preferred, and 100% being most preferred. In some embodiments, the plastic material will also contain a UV blocker.

The adhesive (242) of the lighting element (200) of the lighting apparatus kit may be a type of adhesive disclosed herein. One preferred adhesive is VHB tape available from 3M Company of Maplewood, Minn. The adhesive may comprise a removable backing member (244) which can be peeled off prior to attaching the lighting element to the lighting trim ring (100) by way of the adhesive.

Installation of the lighting apparatus (10) disclosed herein may involve any number of methods. The preferred method includes a lighting element (200) having an adhesive (242) attached to a bottom face (310) of the plastic material with the adhesive comprising a removable backing member (244).

In such an embodiment, the method may first comprise removing the removable backing member (244). Preferably this step may be done by hand. After removing the removable backing member, the lighting element (200) may be adhered to the protrusion (140) extending from the lighting trim ring outer surface (110). Again, this step may be done by hand by aligning the lighting element and the protrusion, placing the bottom face (310) of the plastic material having the adhesive (242) against the protrusion, and applying a pressure to adhere the bottom face of the plastic material to the protrusion. Next, the electric communication connection (230) may be connected to a power source located within the vehicle. Again, this step may be done by hand. Finally, the lighting trim ring (100) may be attached to an automotive lighting fixture (410) located on the vehicle.

One of ordinary skill will recognize that the lighting apparatus may be installed by first attaching the lighting element (200) to the lighting trim ring (100) and then attaching the lighting trim ring to the automotive lighting fixture (410). Alternatively, the lighting apparatus may be installed by first attaching the lighting trim ring to the automotive lighting fixture, and then attaching the lighting element to the lighting trim ring. Either method is considered acceptable.

By installing the lighting element onto an outer surface of the lighting trim ring, the lighting element can be easily installed without requiring removal, un-sealing, re-sealing, and re-installation of the existing lighting fixture. This greatly reduces the time and effort required to customize ones automotive lighting.

Additionally, installing the lighting element onto an outer surface of the lighting trim ring reduces or eliminates the issues associated with blocking or interfering with the light output of existing, factory installed lighting. The lighting element can be protected from the damaging effects of precipitation and/or road debris by the sealed plastic material as opposed to being inside the existing lighting fixture where it can block or interfere with the light output of the existing factor installed lighting.

What is claimed is:

1. A lighting apparatus (10) for a vehicle comprising:
   a lighting trim ring (100); and
   a lighting element (200) comprising:
      a printed circuit board (210),
      a plurality of light emitting diodes (220) each mounted on the printed circuit board, and
      an electrical communication connection (230) connected to the printed circuit board; and
   wherein the printed circuit board and the plurality of light emitting diodes are sealed in a polymer material (300), the lighting element is attached to a lighting trim ring outer surface (110), the lighting trim ring is adapted to fit at least partially around an existing automotive lighting fixture (410), and the lighting trim ring is configured to block less than 20% of a light output from the existing automotive lighting fixture.

2. The lighting apparatus of claim 1, wherein the lighting trim ring comprises at least one automotive lamp opening (130), and the lighting trim ring outer surface defines at least a portion of a perimeter of the automotive lamp opening.

3. The lighting apparatus of claim 1, wherein the plurality of light emitting diodes comprises at least one LED selected from the group consisting of a white LED, a color changing LED, a red LED, a green LED, a blue LED, an orange LED, a yellow LED, a purple LED, and an amber LED.

4. The lighting apparatus of claim 1, wherein the polymer material is selected from the group consisting of epoxies, silicones, thermosets, and thermoplastics.

5. The lighting apparatus of claim 1, wherein the polymer material comprises a non-conductive resin, and wherein the non-conductive resin is a di-electric resin.

6. The lighting apparatus of claim 1, wherein the polymer material contains one or more features selected from the group consisting of coloring, opaque materials, texturing, or diffusing materials.

7. The lighting apparatus of claim 1, wherein the polymer material is contained within a shell, and wherein the shell is made of a rigid material selected from the group consisting of polyesters, polyamides, polyurethanes, and glass.

8. The lighting apparatus of claim 7, wherein the shell contains one or more features selected from the group consisting of coloring, opaque materials, texturing, or diffusing materials.

9. The lighting apparatus of claim 1, wherein the lighting element is attached to the lighting trim ring outer surface by an attachment mechanism selected from the group consisting of an adhesive, a tape, one or more clips, one or more screws, and combinations thereof.

10. A lighting apparatus kit for a vehicle comprising:
    a lighting trim ring (100); and
    a lighting element (200) comprising:
        a printed circuit board (210) having a first face (212) and a second face (214),
        a plurality of light emitting diodes (220) mounted on the first face, said plurality of light emitting diodes and said printed circuit board being sealed in a polymer material (300),
        an electric communication connection (230) connected to the printed circuit board, and
        an adhesive (242) attached to a bottom face (310) of the polymer material corresponding to the second face; and
    wherein the lighting trim ring is adapted to fit at least partially around an existing automotive lighting fixture (410), and the lighting trim ring is configured to block less than 20% of a light output from the existing automotive lighting fixture.

11. The lighting apparatus kit of claim 10, wherein the lighting trim ring comprises at least one automotive lamp opening (130), and a lighting trim ring outer surface (110) defines at least a portion of a perimeter of the automotive lamp opening.

12. The lighting apparatus kit of claim 10, wherein the plurality of light emitting diodes comprises at least one LED selected from the group consisting of a white LED, a color changing LED, a red LED, a green LED, a blue LED, an orange LED, a yellow LED, a purple LED, and an amber LED.

13. The lighting apparatus kit of claim 10, wherein the polymer material is selected from the group consisting of epoxies, silicones, thermosets, and thermoplastics.

14. The lighting apparatus kit of claim 10, wherein the polymer material comprises a non-conductive resin, and wherein the non-conductive resin is a di-electric resin.

15. The lighting apparatus kit of claim 10, wherein the polymer material contains one or more features selected from the group consisting of coloring, opaque materials, texturing, or diffusing materials.

16. The lighting apparatus kit of claim 10, wherein the polymer material is contained within a shell, and wherein the shell is made of a rigid material selected from the group consisting of polyesters, polyamides, polyurethanes, and glass.

17. The lighting apparatus kit of claim 16, wherein the shell contains one or more features selected from the group consisting of coloring, opaque materials, texturing, or diffusing materials.

18. A method of installing a lighting apparatus (10) onto a vehicle, said lighting apparatus comprising a lighting trim ring (100); a lighting element (200) comprising a plurality of light emitting diodes (220) mounted on a printed circuit board (210) and sealed in a polymer material (300), an electric communication connection (230) connected to the printed circuit board; and an adhesive (242) attached to a bottom face (310) of the polymer material said adhesive comprising a removable backing member (244), said method comprising the steps of:
    a. removing the removable backing member,
    b. adhering the lighting element to a protrusion (140) of a lighting trim ring outer surface (110),
    c. connecting the electric communication connection to a power source located within the vehicle, and
    d. attaching the lighting trim ring to an automotive lighting fixture (410)
    wherein the lighting trim ring is configured to block less than 20% of a light output from the automotive lighting fixture.

* * * * *